(12) United States Patent
Treese et al.

(10) Patent No.: US 10,826,270 B2
(45) Date of Patent: Nov. 3, 2020

(54) HEATER-ON-HEATSPREADER

(71) Applicant: Automotive Coalition for Traffic Safety, Inc., Washington, DC (US)

(72) Inventors: Derek Treese, Tustin, CA (US); Nicolas Koslowski, Würzburg (DE); Michael Legge, Würzburg (DE); Wolfgang Zeller, Würzburg (DE)

(73) Assignee: Automotive Coalition for Traffic Safety, Inc., Washington, DC (US)

( * ) Notice: Subject to any disclaimer, the term of this patent is extended or adjusted under 35 U.S.C. 154(b) by 0 days.

(21) Appl. No.: 15/343,513

(22) Filed: Nov. 4, 2016

(65) Prior Publication Data

US 2017/0194763 A1 Jul. 6, 2017

Related U.S. Application Data

(60) Provisional application No. 62/274,543, filed on Jan. 4, 2016.

(51) Int. Cl.
*H01S 5/06* (2006.01)
*H01S 5/024* (2006.01)
(Continued)

(52) U.S. Cl.
CPC ........ *H01S 5/0612* (2013.01); *H01S 5/02453* (2013.01); *H01S 5/02476* (2013.01);
(Continued)

(58) Field of Classification Search
CPC ............ H01S 5/02453; H01S 5/02476; H01S 5/4025–426
See application file for complete search history.

(56) References Cited

U.S. PATENT DOCUMENTS 4,238,759 A * 12/1980 Hunsperger ............ H01L 23/38
257/712
5,150,371 A * 9/1992 Abramov ................ H01L 23/38
257/E23.082
(Continued)

FOREIGN PATENT DOCUMENTS

EP 2161800 3/2010
JP 3-48477 3/1991
(Continued)

OTHER PUBLICATIONS

International Search Report and Written Opinion dated Nov. 13, 2014 for PCT/US2014/050575.
(Continued)

*Primary Examiner* — Joshua King
(74) *Attorney, Agent, or Firm* — Pandiscio & Pandiscio

(57) ABSTRACT

Systems and methods are described herein to thermally regulate laser diodes. During operation, the structure of a laser diode may generate heat, which will affect the stability and accuracy of the output wavelength of the laser diode. During an OFF stage, the structure of the laser diode will then lose heat, creating a thermal gradient as the laser diode is switched between operation and an OFF state. The systems and methods provide constant average heat and a stable thermal gradient by integrating a laser diode power-coupled supply and a heater onto a heatspreader, such that the output wavelength of a coupled laser diode may be stabilized.

15 Claims, 6 Drawing Sheets

(51) Int. Cl.
*H01S 5/40* (2006.01)
*H01S 5/068* (2006.01)

(52) U.S. Cl.
CPC ....... *H01S 5/02415* (2013.01); *H01S 5/06804* (2013.01); *H01S 5/4025* (2013.01); *H01S 5/4087* (2013.01)

(56) References Cited

U.S. PATENT DOCUMENTS

| | | | |
|---|---|---|---|
| 5,515,391 A * | 5/1996 | Endriz | H01S 5/02248 372/34 |
| 6,219,362 B1 | 4/2001 | Hillmer et al. | |
| 6,449,295 B1 * | 9/2002 | Ostromek | H01S 5/02453 257/601 |
| 6,534,794 B1 * | 3/2003 | Nakanishi | H01L 33/64 257/79 |
| 6,553,044 B1 | 4/2003 | Eden | |
| 7,480,317 B2 * | 1/2009 | Hu | H01S 5/0612 372/21 |
| 7,961,766 B2 | 6/2011 | Chen et al. | |
| 7,961,769 B2 | 6/2011 | Fujiwara et al. | |
| 8,667,092 B1 | 3/2014 | Shum et al. | |
| 8,699,533 B1 * | 4/2014 | Wach | H01S 5/02212 372/34 |
| 9,281,658 B2 | 3/2016 | Treese et al. | |
| 2001/0024462 A1 * | 9/2001 | Nakahara | H01S 5/02252 372/43.01 |
| 2003/0095736 A1 * | 5/2003 | Kish, Jr. | B82Y 20/00 385/14 |
| 2005/0169327 A1 * | 8/2005 | Eden | H01S 5/4031 372/29.02 |
| 2006/0203862 A1 * | 9/2006 | Bonen | H01S 5/02453 372/34 |
| 2007/0092177 A1 * | 4/2007 | Nilsson | B82Y 20/00 385/14 |
| 2007/0153848 A1 * | 7/2007 | Fratti | G11B 33/1406 372/36 |
| 2009/0238219 A1 | 9/2009 | Nakamoto | |
| 2010/0142572 A1 | 6/2010 | Chen et al. | |
| 2010/0220755 A1 * | 9/2010 | Frank | B82Y 20/00 372/36 |
| 2011/0164633 A1 | 7/2011 | Moench et al. | |
| 2012/0250713 A1 | 10/2012 | Maeda et al. | |
| 2013/0136403 A1 * | 5/2013 | Yasui | H01S 5/0687 385/88 |
| 2015/0103852 A1 * | 4/2015 | Treese | H01S 5/02248 372/29.021 |

FOREIGN PATENT DOCUMENTS

| | | | | |
|---|---|---|---|---|
| JP | 4-30487 | 2/1992 | | |
| JP | 4-115585 | 4/1992 | | |
| JP | 5-41558 | 2/1993 | | |
| JP | 7-249818 | 9/1995 | | |
| JP | 10-256676 | 9/1998 | | |
| JP | 10-270745 A | 10/1998 | | |
| JP | 11-220213 | 8/1999 | | |
| JP | 2001-102674 | 4/2001 | | |
| JP | 2001102674 A * | 4/2001 | ............ | G02B 6/42 |
| JP | 2001-230486 | 8/2001 | | |
| JP | 2001-267639 | 9/2001 | | |
| JP | 2015-201549 | 11/2015 | | |
| JP | 2016-111214 | 6/2016 | | |
| WO | WO 02/065598 | 8/2002 | | |
| WO | WO 2007/005755 | 1/2007 | | |
| WO | WO 2010015352 A2 * | 2/2010 | ............ | H01S 5/024 |
| WO | WO 2014072681 A2 * | 5/2014 | ............ | H01L 23/34 |

OTHER PUBLICATIONS

PCT International Search Report and Written Opinion in Application No. PCT/US2016/060622, dated Mar. 2, 2017 (13 pages).

\* cited by examiner

HEATER-ON-HEATSPREADER

CROSS REFERENCE TO RELATED APPLICATIONS

This claims the benefit of U.S. Provisional Patent Application No. 62/274,543 filed on Jan. 4, 2016, the entire contents of which are hereby incorporated by reference.

STATEMENT REGARDING FEDERALLY SPONSORED RESEARCH OR DEVELOPMENT

This invention was made with Government support under contract number DTNH22-08-H-00188 awarded by the National Highway Traffic Safety Administration. The government has certain rights to this invention.

FIELD OF THE INVENTION

This invention relates to thermal regulation of laser diodes, particularly in fast switching applications requiring short settling times of the laser diode output wavelength.

BACKGROUND OF THE INVENTION

The output wavelength of a semiconductor laser can be affected by temperature of the laser assembly. For example, laser diodes operating in the 1.65 µm wavelength spectrum can have a 0.1 nm change in output wavelength in response to a 1.0° C. change in temperature. In laser applications in which a single output wavelength is desired, temperature regulation of the laser assembly can affect operation and accuracy. This is especially true in fast-switching applications, in which the laser diode may be rapidly turned from an OFF state to an ON state. In order to reduce the settling time of the ON state for the laser diode to reach its target wavelength, additional heat regulation techniques may be required.

SUMMARY OF THE INVENTION

The systems and methods described herein thermally regulate laser diodes. In particular, the systems and methods are designed to provide a constant average thermal transfer to a heatspreader even as a laser diode is rapidly switched from an OFF state to an ON state. This provides a stable thermal gradient to the laser diode and improves the stability of its output wavelength.

In an example of a heater-on-heatspreader system, there is provided a heatspreader for distributing heat from a first power-coupled source and a second power-coupled source, both of which are integrated into the heatspreader. The first power-coupled source is in electrical and thermal connection with a heat generating device. The second power-coupled source is in electrical connection with a thermal generator, which is also integrated into the heatspreader. The first power-coupled source and the second power-coupled source are cycled between an OFF state and an ON state to maintain a constant average thermal transfer to the heater-on-heatspreader. In some embodiments, the thermal generator is a resistive heater. In some embodiments, the heat generating device is a laser diode which operates at a single wavelength. In some embodiments, a first thermal output from the laser diode during an ON state is compensated by a second thermal output from the thermal generator during the laser diode OFF state. In some embodiments, the laser diode is preheated by the thermal generator. In some embodiments, an output wavelength of the laser diode is tuned to a target wavelength by adjusting the second thermal output.

In some embodiments of the heater-on-heatspreader system, the heater-on-heatspreader is mounted to a temperature control plate such that the heater-on-heatspreader and the temperature control plate are both in thermal and electrical connection. In some embodiments, the temperature control plate is thermally coupled to a plurality of heaters-on-heatspreaders with a plurality of mounted laser diodes. In some embodiments, a first subset of the plurality of mounted laser diodes may have a first target output wavelength, and a second subset of the plurality of mounted laser diodes may have a second target output wavelength. When one laser diode in the plurality of laser diodes is thermally tuned by changing the power supplied to either the heater or the laser diode power-coupled source, the temperature of the thermally coupled temperature control plate does not change.

In some embodiments of the heater-on-heatspreader system, logic in signal communication with the first power-coupled source and the second power-coupled source may include calibration data for the laser diode. In some embodiments, the logic modulates power between the first power-coupled source and the second power-coupled source. In some embodiments, the logic measures a temperature of the laser diode.

In an example of a method of thermally regulating a laser diode, the method may include using external logic to modulate power between a heater power-coupled supply electrode and a laser diode power-coupled supply electrode. The method includes adjusting an output wavelength of the laser diode based on laser diode calibration data stored in external logic. The method includes maintaining an average thermal transfer of the heater power-coupled supply electrode and the laser diode power-coupled supply electrode to a heater-on-heatspreader.

In some embodiments, the method includes stabilizing the output wavelength of the laser diode within 10 µs after modulating between the heater power-coupled supply electrode and the laser diode power-coupled supply electrode. In some embodiments, adjusting the output wavelength of the laser diode based on laser diode calibration data, which is stored in external logic, includes determining a temperature of the laser diode from an electrical parameter measured from the heater-on-heatspreader.

BRIEF DESCRIPTION OF THE DRAWINGS

Features of the invention, its nature and various advantages will be apparent upon consideration of the following detailed description, taken in conjunction with the accompanying drawings, in which like reference characters refer to like parts throughout, and in which.

DETAILED DESCRIPTION

Figure 1:
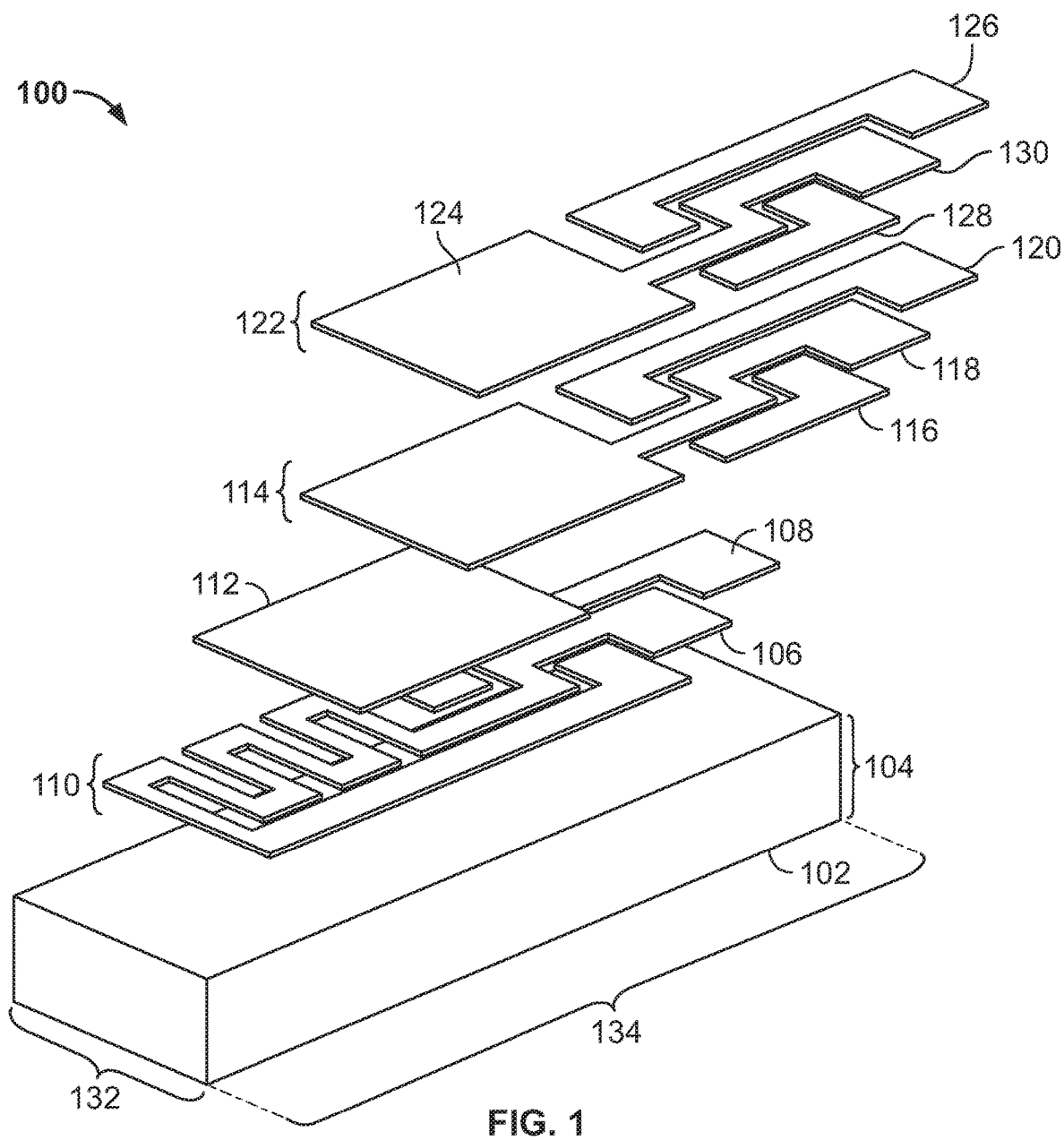
FIG. 1 depicts an exploded perspective view of a heater-on-heatspreader, according to an illustrative implementation.

The output wavelength of a semiconductor laser can vary as a result of changes in the semiconductor device temperature. Power supplied to a laser diode is converted both to electromagnetic energy in the form of the output wavelength, and heat energy that may be dissipated away from the laser diode and transferred to thermally coupled structures. Thus as the laser diode operates, the heat generated from the laser diode may heat up the laser diode assembly and its surrounding structures. Many laser diode assemblies are thermally coupled to heatspreaders, heat sinks, preheaters, or other heat regulating structures, or use other control methods to mitigate thermal variation and maintain the desired nominal laser diode wavelength.

Because the temperature of the laser diode assembly affects its output wavelength, a stabilization interval is typically required for the laser diode to reach its target output wavelength. During the stabilization interval, the laser diode assembly reaches a thermal equilibrium and the output wavelength settles to its final value. In the context of fast switching, in which the laser diode is turned from an OFF state to an ON state quickly, the stabilization interval may affect accuracy of the laser diode system, because the thermal control circuit may require settling time and/or the output wavelength may oscillate around the target wavelength during the stabilization interval. In applications in which the output wavelength accuracy directly affects a measurement accuracy and timing (such as in spectroscopy) minimizing this stabilization interval improves the accuracy and sample time of the overall system and measurement. Previous solutions to the thermal stabilization problem have included feedback loops that adjust the input power while detecting the output wavelength, dual junction laser diode assemblies, and monolithically integrated preheaters. In dual junction laser diode assemblies, identical laser diodes are thermally coupled. One laser diode is "active," meaning that its output wavelength is used, while the other laser diode is used simply for temperature control. When the active laser diode is turned ON, power is directed to the active laser diode and turned OFF in the second laser diode. When the active laser diode is then turned OFF, the same power is re-directed to the second laser diode. Thus the power modulates between the active laser diode and the second laser diode, maintaining a thermodynamic equilibrium across the thermally coupled laser diodes because the heat generation lost by turning the active laser diode OFF is replaced by the heat generated by the second laser diode turning ON. In monolithically integrated heaters, a preheater may be incorporated into the laser diode to generate heat while the laser diode is in an OFF state.

However, these solutions require additional dedicated circuitry, result in larger device footprints, produce lower device yields that are dependent on both the laser diode and heater yield, and are more expensive because a second laser diode is used solely for thermal generation, or additional feedback and detection devices are required. Additionally, in both dual junction structures and typical monolithically integrated preheater structures, the compensating heat is unevenly applied to the active laser diode, producing a thermal gradient inside the laser diode that may cause further fluctuations and instability in the output wavelength.

To provide an overall understanding of this disclosure, certain illustrative implementations will now be described, including systems for heat regulation of laser diodes. The systems and methods described herein include heaters-on-heatspreaders, which integrate heat-generating power-coupled supplies with a heater disposed on a heatspreading substrate. A heat-generating device, such as a laser diode, is coupled to the heater-on-heatspreader and is thermally regulated by the heater-on-heatspreader. The power-coupled supplies are coupled to external power sources, and transfer power and signals from these external power sources to both the heat-generating device and the heater in the heater-on-heatspreader. The heater will compensate for the heat loss associated with turning the heat-generating device to an OFF state. Consolidating the power-coupled supply for the heat-generating device, which may be a laser diode, the power-coupled supply for the heater, and the heater onto a single heater-on-heatspreader may allow for modulation and thermal control of a heat generating device by this single heater-on-heatspreader system. This is especially useful in the context of fast-switching lasers, in which rapid stabilization of the output wavelength is desired, because of the dependence of the output wavelength on the thermal output associated with powering the laser diode itself.

FIG. 1 depicts an exploded perspective view of a heater-on-heatspreader, according to an illustrative implementation. A conductive layer 110 is integrated with a bottom substrate layer 102 with thickness 104, width 132 and length 134. The bottom substrate layer 102 is a heatspreader made of thermally conducting material and capable of dissipating heat. The conductive layer 110 includes a power-coupled supply electrode 108 which conveys power from an external power source (not shown) to a heat generating device, such as a laser diode (not shown) and a heater structure 106. An insulating layer 112 separates the conductive layer 110 from a bottom contact layer 114. The top layer 122 is in contact with a heat generating device, which may be a laser diode or any other heat generating device whose heat output is primarily a function of its power supply.

The bottom substrate layer 102 may be made of any thermally conductive material. The bottom substrate layer 102 may also be electrically insulating. The bottom substrate layer 102 may be made of Aluminum nitride (AlN), which is both highly thermally conductive and electrically insulating. The bottom substrate layer 102 may also be made of Alumina ($Al_2O_3$), Silicon (Si), any technical ceramic or any other material that may be highly thermally conductive. The bottom substrate layer 102 may be thermally coupled to a heat sink. The bottom substrate layer 102 may be mounted to a temperature control plate such as a thermoelectric cooler (TEC) that may itself be in electrical communication with temperature control circuitry capable of adjusting the temperature of the plate. The temperature control circuitry may include a feedback loop to adjust the temperature of the TEC. The temperature control circuitry may hold the TEC at a stable temperature. The bottom substrate layer has a thickness 104, which may be chosen in part by the average power input to the conductive layer 110, the heat generated by the heater structure 106, the width of the substrate 132 and/or the length of the substrate 134. The dimensions 104, 132 and 134 may be chosen such that the thermal gradient across the top of the substrate in contact with the conductive layer 110 is as close to zero as possible, as discussed in more detail with reference to FIG. 11.

The layers 102, 110, 112, 114, 122 may be formed by sputtering, evaporation, spin coating, electro-plating, or any other process capable of adhering and depositing layers 102, 110, 112, 114 and 112. The conductive layer 110 is composed of a conductive material, such as platinum (Pt). The conductive layer 110 includes a power-coupled supply electrode 108, and a heater structure 106 that includes the electrode for the heater, the heater, and joint ground. The insulating layer 112 covers the heater structure 106, and may not cover the power-coupled supply electrode 108. Thus the insulating layer 112 is placed such that its area is primarily over the main source of heat from the conductive layer 110. The bottom contact layer 114 includes three components: the power-coupled supply electrode contact 120, the heater and common ground contact 118, and the heater power-coupled supply contact 116 which covers the electrode of the heater structure.

The top contact layer 122 similarly includes three separate components, and may, as shown in FIG. 1, be of the same form as the bottom contact layer 114: the top power-coupled supply contact 126, the heater and common ground top contact 130, and the top heater power-coupled supply contact 128. The top contact layer 122 is made of a metal, such as Ti, Pt, Au, a metal alloy of Ti, a metal alloy of Pt, a metal alloy of Au, or any other metal or metal alloy that is suitable for contact with a semiconductor laser or device to which the heater-on-heatspreader is mounted. The top contact layer 122 may be a low-resistance material that forms electrical contact with a laser or heat generating device. The top contact layer 122 may be formed by plating the bottom contact layer 114 with a suitable metal, such as Au. The top contact layer 122 may also be formed by electro-plating, sputtering, thermal evaporation, electron beam evaporation, or any other process capable of depositing the suitable metal.

Figure 2:
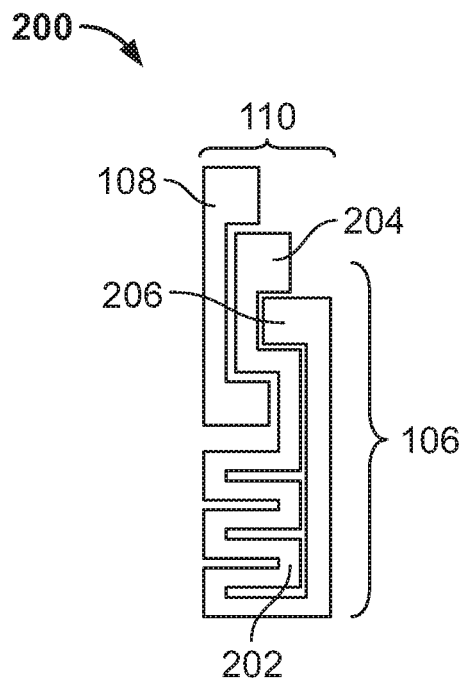
FIG. 2 depicts a conductive layer of a heater-on-heatspreader, according to an illustrative implementation.

FIG. 2 depicts a conductive layer of a heater-on-heatspreader, according to an illustrative implementation. The conductive layer 110 shown by the overhead view 200 includes a power-coupled supply electrode 108, which is used to convey power from an external power source (not shown) to a laser diode or an externally mounted heat generating device, and a heater structure 106. The heater structure 106 includes a joint ground 204, a resistive heater 202, and a heater power-coupled supply electrode 206. This power source may be a controlled current source powered by a battery, electric mains, or automotive electrical system. There is a voltage drop between the heater power-coupled supply electrode 206 and the joint ground 204 as a result of resistance of the heater 202. The output heat of the heater 202 is a function of this voltage drop, as well as an input current. If the heat generator 202 is a resistive heater, the heat output can be written as a relation between the resistance or R value of the resistive heater and the input current I given by the Joule-Lenz law:

$$H \propto I^2 R t \qquad (1)$$

where H is the output dissipated heat produced by the heater, and t is a time interval over which the heater is supplied with a current I. As can be appreciated from Equation (1), the output heat of the heater can be dynamically adjusted by changing the input current I, or the time interval t over which the heater-on-heatspreader is powered. The output heat of the heater may also be adjusted by changing the resistance value R of the heater. Typical resistance R values may range from 1 to 100 Ohms, with optimal R values at 3.7±0.2 Ohm for a resistive heater made of 300 nm Titanium (Ti), or 10.0±0.3 Ohm for a resistive heater made of 120 nm Ti. Increasing the width of the resistive heater may also increase the heat output of the heater.

The heater is shown here as multiple "S" shaped turns placed at one end of the substrate. The total length of the heater electrode will partially determine its resistance, and thus the length of the resistive heater may be adjusted to achieve the desired resistance and heat output. The resistive heater may also be arranged in a different configuration from the "S" shapes shown in FIG. 2. The total area occupied by the heater may be adjusted to match the footprint of a coupled heat generating device, such as a laser diode.

Figure 3:
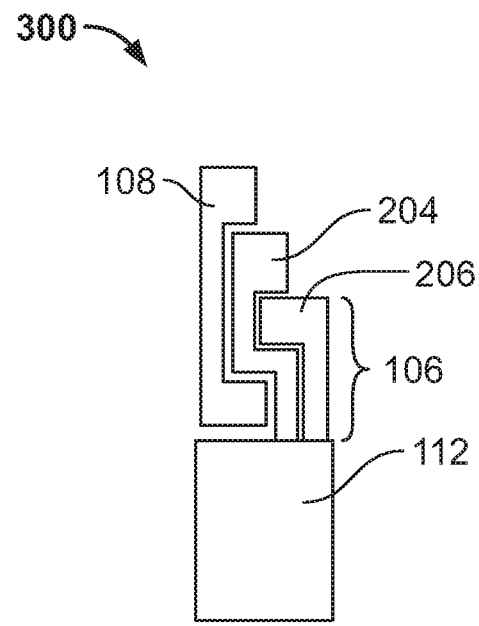
FIG. 3 depicts an insulating layer of a heater-on-heatspreader, according to an illustrative implementation.

FIG. 3 depicts an insulating layer of a heater-on-heatspreader, according to an illustrative implementation. The insulating layer 112 may cover only the main heat generating area of the heater structure 106, which may be a resistive heater portion of the heater structure 106. The insulating layer 112 may be made from any electrically insulating material, such as a polyamide. The joint ground 204, power-coupled supply electrode 108 and heater power-coupled supply electrode 206 may be left uncovered by the insulating layer 112. Insulating layer 112 provides additional insulation for the primary heat generating structure of the conductive layer 110 below. Insulating layer 112 distributes the heat generated by the heater structure 106 evenly across the surface of a coupled heat generating device, such as a laser diode (not shown), and the bottom substrate layer 102 as shown in FIG. 1.

Figure 4:
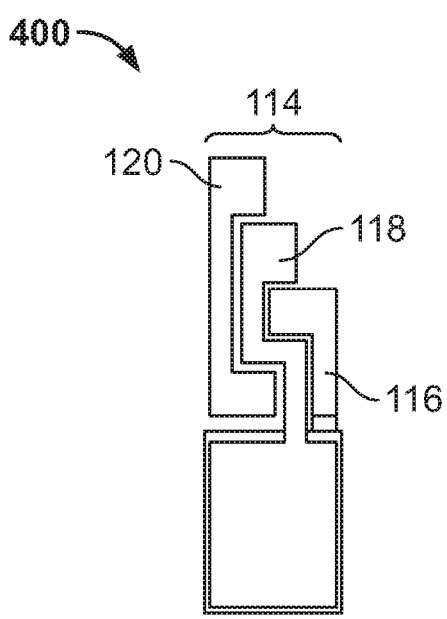
FIG. 4 depicts a bottom contact layer of a heater-on-heatspreader, according to an illustrative implementation.

FIG. 4 depicts a bottom contact layer of a heater-on-heatspreader, according to an illustrative implementation. The first contact layer shown by the overhead cross section 400 includes three separate components: a power-coupled supply contact 120, a heater and joint ground contact 118, and a heater power-coupled supply contact 116 which covers the heater power-coupled supply electrode 206 of the heater structure 106 as shown in FIGS. 2 and 3. The power-coupled supply contact 120 covers the power-coupled supply electrode 108 as shown in FIGS. 2 and 3. The heater and joint ground contact 118 covers both the heater portion 202 of the heater structure 106 and the joint ground 204 as shown in FIGS. 2 and 3. The heater power-coupled supply contact 116 covers only the positive electrode for the heater. Thus the bottom contact layer 114 electrically isolates the power-coupled supply electrode 108 from the joint ground 204.

Figure 5:
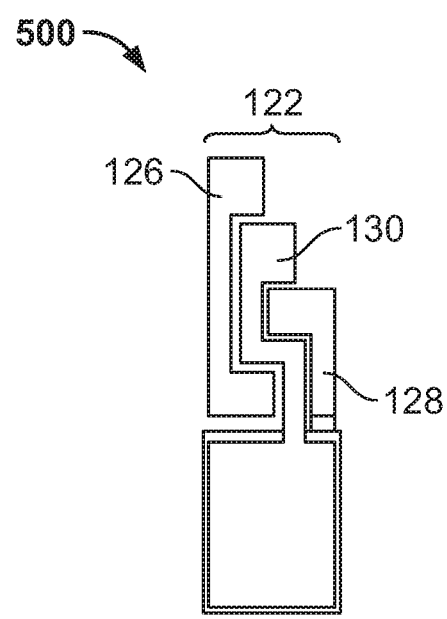
FIG. 5 depicts a top contact layer of a heater-on-heatspreader, according to an illustrative implementation.

FIG. 5 depicts a top contact layer of a heater-on-heatspreader, according to an illustrative implementation. The top contact layer 122 is formed by coating the bottom contact layer 114 with a suitable metal for bonding to the laser diode or mounted device. This metal may be gold (Au)

or another suitable metal for soldering, gluing or wire bonding semiconductors, such as Aluminum (Al), Copper (Cu), or Silver (Ag). This top contact layer 122 provides a surface for wire bonding on the heater-on-heatspreader shown at 500. The top contact layer 122 includes the top power-coupled supply contact 126, the heater and common ground top contact 130, and the top heater power-coupled supply contact 128. Wire bonding (not shown) may be formed between any of the elements 126, 130 or 128 and an external heat generating device (not shown) or between any of the elements 126, 130 and 128 themselves.

Figure 6:
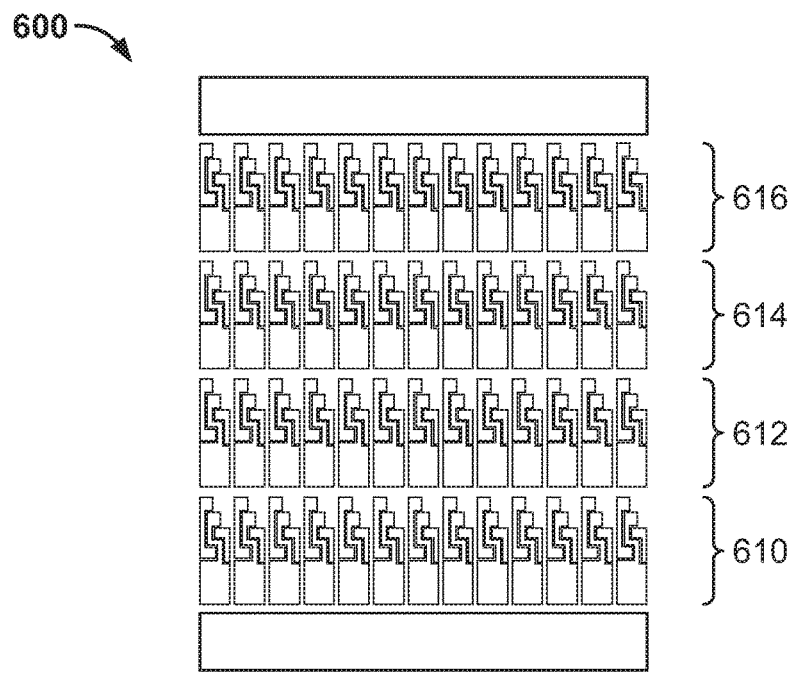
FIG. 6 depicts an overhead view of multiple heaters-on-heatspreaders as manufactured on a single sheet, according to an illustrative implementation.
Figure 9:
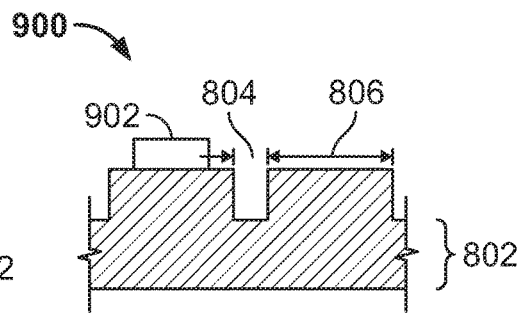
FIG. 9 depicts a side view of a heater-on-heatspreader with a laser diode assembly, according to an illustrative implementation.

FIG. 6 depicts an overhead view of multiple heaters-on-heatspreaders as manufactured on a single sheet, according to an illustrative implementation. The sheet 600 is composed of several rows of heaters-on-heatspreaders, such as row 616, 614, 612 and 610. Each of the rows 616, 614, 612 and 610 includes the desired number of heaters-on-heatspreaders, which may be determined by the device specifications in which the heaters-on-heatspreaders are incorporated. The number of heaters-on-heatspreaders may be determined by the total number of wavelengths required by the device. Rows 616, 614, 612 and 610 are each separated from each other, leaving an array of heaters-on-heatspreaders within each row, which may then be incorporated into the desired device. Each heater-on-heatspreader within each of the rows 616, 614, 612 and 610 may have a laser diode or other heat generating device mounted to a contact layer of the heater-on-heatspreader, as shown in FIGS. 7 and 9.

Each of the heaters-on-heatspreaders within rows 610, 612, 614 and 616 may be the heater-on-heatspreader 100 as shown in FIG. 1, and may thus include multiple layers, as shown in FIGS. 2-5. The layers of the heaters-on-heatspreaders within rows 610, 612, 614 and 616 may be formed simultaneously, such that the sheet 600 is masked, etched and coated as necessary to produce each heater-on-heatspreader. This may allow for efficient and uniform production of many heaters-on-heatspreaders.

Figure 7:
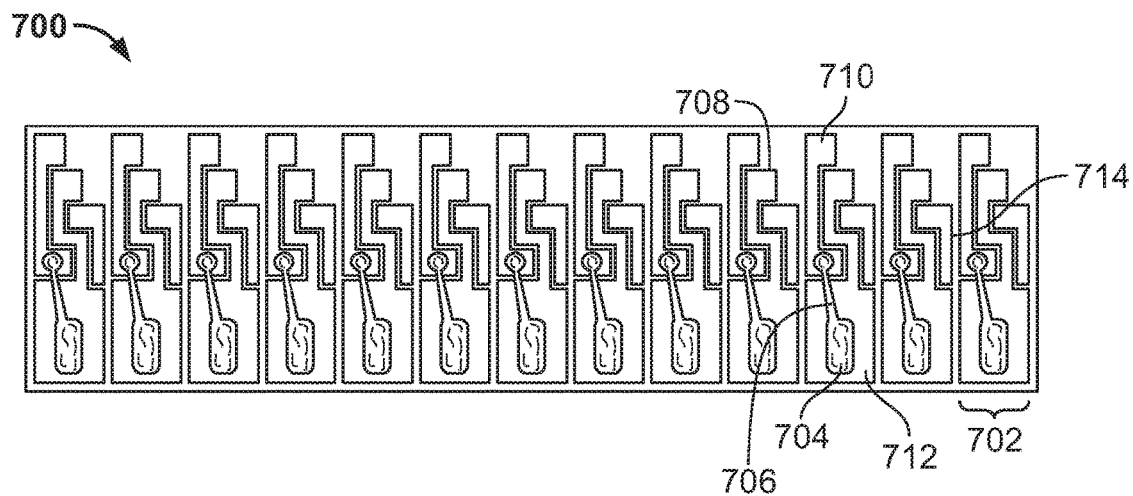
FIG. 7 depicts an overhead view of an array of heaters-on-heatspreaders with laser diode assemblies, according to an illustrative implementation.

FIG. 7 depicts an overhead view of an array of heaters-on-heatspreaders with laser diode assemblies, according to an illustrative implementation. The array of mounted laser diodes on heaters-on-heatspreaders 700 may be formed from one of the rows 610, 612, 614 or 616 as shown in FIG. 6, and may therefore be fabricated with other arrays on a single sheet as shown at 600 in FIG. 6. Each individual heater-on-heatspreader and laser diode assembly, as shown at 702, has a mounted laser diode, shown at 704. The mounted laser diode 704 is bonded to the laser diode contact layer 712, which may be primarily placed over a heater structure (not shown) as depicted in FIG. 1-5. The laser diode contact layer 712 may be contiguous with the joint ground 708, also as depicted in FIG. 1-55. The laser diode 704 may be wire bonded with bonding 706 to a laser diode power-coupled supply 710. The laser diode power-coupled supply 710 may be separately wire bonded or otherwise electrically coupled to an external power supply (not shown). The external power supply will power the laser diode 704. The bonding 706 may be made of gold (Au) or another suitable metal for wire bonding semiconductors, such as Aluminum (Al), Copper (Cu), or Silver (Ag) or any compound thereof that may have a low resistance value. The laser diode 704 may be connected to the laser diode power-coupled supply 710 with any other material capable of providing low resistance electrical connection. The heater (not shown) located below the laser diode 704 is powered by a heater power-coupled supply 714. The heater power-coupled supply 714 may be separately wire bonded or otherwise electrically coupled to an external power supply (not shown). The external power supply will power the heater structure. The heater power-coupled supply 714 may be in signal communication with external logic, such as the logic described in further detail with reference to FIG. 11. The heater power-coupled supply 714 and the laser diode power-coupled supply 710 may both be in signal communication with the same external logic (not shown), such as the logic described in further detail with reference to FIG. 11.

The laser diodes shown in FIG. 7 may each have a different target output wavelength. The heaters under each of the laser diodes in the array of mounted laser diodes on heaters-on-heatspreaders 700 may have different heat outputs depending on the target output wavelength of the laser diode, such as laser diode 704 as shown in FIG. 7. Each of the laser diodes in the array of mounted laser diodes on heaters-on-heatspreaders 700 may be separately calibrated after each of the respective laser diodes has been mounted. Calibration may include determining the dependency of the output wavelength of the input voltage, current, and duration of ON or OFF time of the power supply to the laser diode power-coupled supply, such as laser diode power-coupled supply 710, and the heater power-coupled supply, such as heater power-coupled supply 714. These parameters and dependencies may be included in calibration values provided to the external logic, such as the logic described further with reference to FIG. 11.

The array of mounted laser diodes on heaters-on-heatspreaders 700 may be thermally coupled to a heat sink (not shown). The array of mounted laser diodes on heaters-on-heatspreaders 700 may be thermally coupled to a TEC (not shown). The heat sink or TEC may be uniformly kept at a single, minimum temperature, while each of the heaters in the array of mounted laser diodes on heaters on heatspreaders 700 raises the temperature of each of the individual laser diodes, such as laser diode 704, to its necessary temperature to produce its target output wavelength. Thus each of the heaters-on-heatspreaders in the array of mounted laser diodes on heaters on heatspreaders 700 may operate independently of each other, providing local heat to each of the individually calibrated laser diodes.

The laser diodes in the array of mounted laser diodes on heaters-on-heatspreaders 700, such as laser diode 704, may be semiconductor laser diodes such as double heterostructure lasers, quantum well lasers, quantum dot lasers, quantum cascade lasers, interband cascade lasers, Vertical-Cavity Surface-Emitting Lasers (VCSELs), Vertical External-Cavity Surface-Emitting lasers (VECSELs), External-cavity diode lasers, or any other semiconductor laser with an output wavelength that is affected by the temperature of the laser diode itself. The laser diodes in the array of mounted laser diodes on heaters-on-heatspreaders 700 may each have the same target output wavelength. The laser diodes in the array of mounted laser diodes on heaters-on-heatspreaders 700 may have different target output wavelengths. A subset of the laser diodes in the array of mounted laser diodes on heaters on heatspreaders 700 may have the same target output wavelengths.

Figure 8:
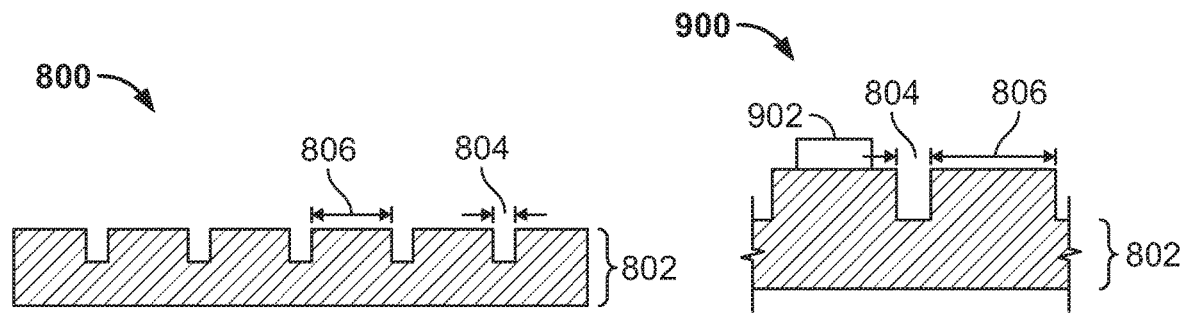
FIG. 8 depicts a side view of multiple heaters-on-heatspreaders as manufactured on a single sheet, according to an illustrative implementation.

FIG. 8 depicts a side view of multiple heaters-on-heatspreaders as manufactured on a single sheet, according to an illustrative implementation. The side view 800 may be a subset of a row of the heaters-on-heatspreaders, such as the rows 610, 612, 614 and 616 as shown in FIG. 6. The width 806 is the width of a single heater-on-heatspreader. The width 806 may be the width 132 as shown in FIG. 1. The height 802 is the height of a single heater-on-heatspreader. The height 802 may be the same as height 104 as shown in FIG. 1. The gap 804 between heaters-on-heatspreaders in the side view 800 may be the distance between individual heaters-on-heatspreaders in the rows 610, 612, 614, and 616. The dimensions 806, 804 and 802 may be chosen to reduce the thermal gradient below a mounted laser diode on the heater-on-heatspreader. Increasing the gap 804 may reduce the thermal affect of one heater on an adjacent heater-on-heatspreader, while reducing the gap 804 may increase the thermal affect of one heater on an adjacent heater-on-heatspreader. Width 806 may range from 100 µm to 5000 µm, with an optimal value of 590 µm. Gap 804 may range from 10 µm to 500 µm with an optimal value of 90 µm. Height 802 may range from 50 µm to 2500 µm with an optimal value of 250 µm.

FIG. 9 depicts a side view of a heater-on-heatspreader with a laser diode assembly, according to an illustrative implementation. The side view 900 shows a laser diode 902 mounted on top of a heater-on-heatspreader of width 806. The side view 900 may show a subset of a row of heater-on-heatspreaders, such as rows 610, 612, 614 and 616 as shown in FIG. 6 or of the array of mounted laser diodes on heaters-on-heatspreaders 700 as shown in FIG. 7. The laser diode 902 is separated from the next heater-on-heatspreader by a gap of 804. The heater-on-heatspreader may have a height 802.

Figure 10:
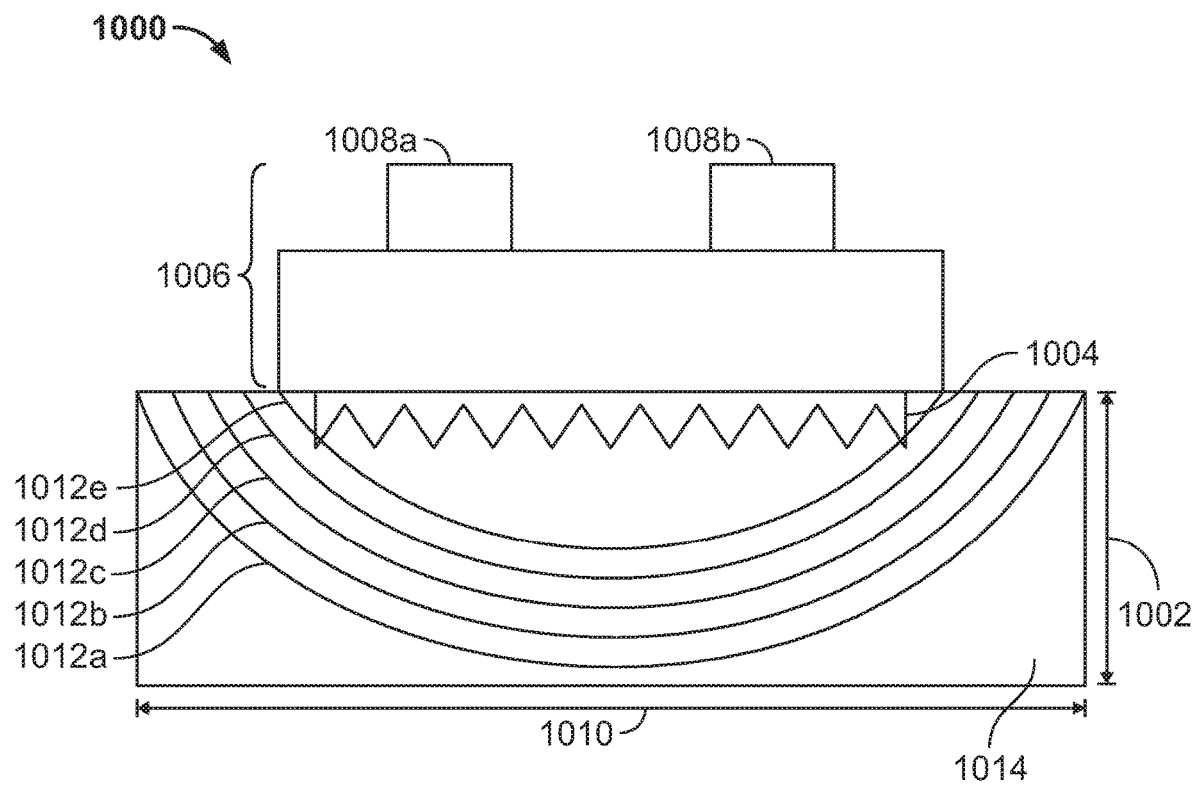
FIG. 10 depicts a thermal gradient across two heaters-on-heatspreaders with two mounted laser diode assemblies, according to an illustrative implementation.

FIG. 10 depicts a thermal gradient across two heaters-on-heatspreaders with two mounted laser diode assemblies, according to an illustrative implementation. The side view 1000 may be the side view 900 as shown in FIG. 9. The first laser diode 1008a and second laser diode 1008b (collectively 1008) are placed symmetrically across the midpoint of the width 1010, such that laser diodes 1008 are equidistant from the midpoint of the width 1010. The heater structure is shown at 1004, and is placed below laser diodes 1008. The heater structure may be heater structure 106 as shown in FIGS. 1 and 2. The contact layer 1006 may be the contact layer 130 as shown in FIGS. 1 and 5, and may include an insulating layer, such as insulating layer 112, a bottom contact layer 114 and a top contact layer 122, as shown in FIGS. 1-5. The laser diodes 1008 may be soldered to the contact layer 1006 or coupled to the contact layer 1006 with a any material that is thermally conducting and electrically conducting and may secure the laser diode 1008 to the contact layer 1006. The heater 1004 is powered by an external power source that conveys power to the heater 1004 via a heater power-coupled supply electrode (not shown), while the laser diodes 1008 is powered by and may be wire bonded to a laser diode power supply (not shown). Laser diodes 1008 may also be connected to the laser diode power supply with any electrically conducting material, which may have a low resistance value.

FIG. 10 is shown with contour lines 1012a, 1012b, 1012c, 1012d and 1012e (collectively 1112) representing contour lines of the heat gradient within the bottom substrate layer 1114, which may be the bottom substrate layer 102 as shown in FIG. 1. The symmetry of the cross section 1000 may improve the stability of the thermal gradient represented by the contour lines 1012, and may allow heat to be evenly distributed across the heater-on-heatspreader and laser diode assembly. The contour lines 1012 show the dependency of the heat gradient on the width 1010 and height 1002 of the bottom substrate layer 1012. In order for the top surface of the bottom substrate layer 1012, which is in contact with the laser diodes, to have minimal temperature fluctuation and thus an approximately flat contour line across the top surface, the total width 1010 of the bottom substrate layer 1012 must be wide enough to allow for this. Laser diodes with different target output wavelengths may require different amounts of heat output from the heater 1004 in order to effectively compensate for the heat produced by the laser diode itself. Thus the dimensions 1010 and 1002 may be adjusted based on the wavelength of the associated laser diodes 1008.

Figure 11:
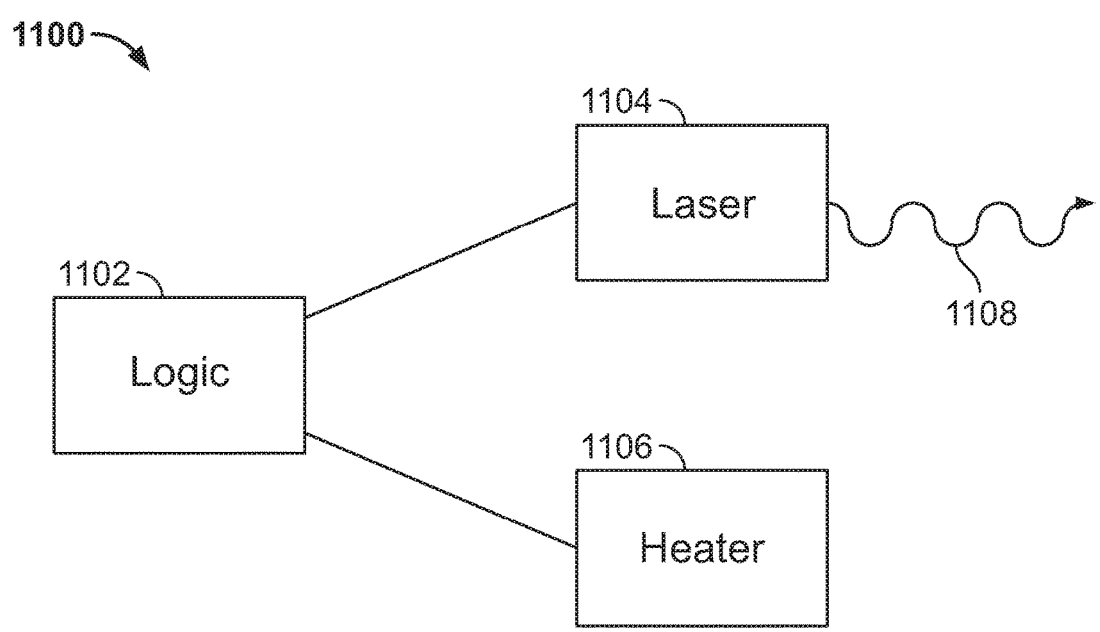
FIG. 11 depicts a control system in electronic communication with a heater-on-heatspreader, according to an illustrative implementation.

FIG. 11 depicts a control system in electronic communication with a heater-on-heatspreader, according to an illustrative implementation. Logic 1102 shown in the schematic 1100 may be any external circuitry or microprocessor capable of modulating power between the laser diode 1104 and the heater 1106. Laser diode 1104 may be any of the laser diodes described herein. Heater 1106 may be any of the heater structures described herein. Logic 1102 may be in separate signal communication with both the laser diode 1104 and the heater 1106. Logic 1102 turns on the heater 1106 to preheat the laser diode 1104 when the laser diode 1104 is not in use. Logic 1102 may include feedback circuitry to fine tune the output wavelength 1108 of the laser diode 1104 by adjusting the current or voltage provided to the laser diode 1104. The output wavelength of a laser diode may be fine-tuned by logic 1102 to within a 1% change in the target output wavelength by altering the current or voltage provided to the laser diode 1104 and/or the heater 1106. Logic 1102 includes timing circuitry to count and adjust the total amount of time that power is supplied to either the laser diode 1104 or the heater 1106. Logic 1102 may have an associated memory to store calibration data, such as a relation between output heat of the heater 1106 and the output wavelength 1108, which is determined from the calibration of each laser diode and heater-on-heatspreader assembly.

Logic 1102 may also include detection circuitry to determine the temperature of the laser diode 1104. Thus the heater-on-heatspreader may also be used as a temperature sensor to detect the temperature of a mounted laser diode. Logic 1102 would thus detect the temperature of the laser diode 1104 by measuring the resistance and voltage drop within a heater-on-heatspreader (not shown). Logic 1102 may include calibration data to determine the temperature dependence of the measured resistance or voltage drop.

Figure 12:
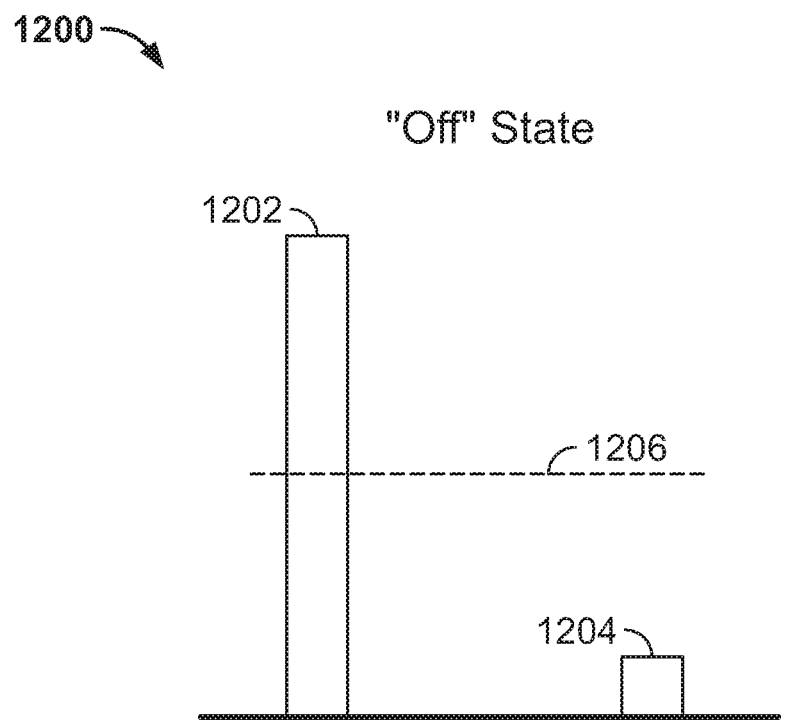
FIG. 12 is a graph showing one logic state of a heater-on-heatspreader control system, according to an illustrative implementation.

FIG. 12 is a graph showing one logic state of a heater-on-heatspreader control system, according to an illustrative implementation. Logic state 1200 is a laser diode OFF state such that the power level supplied to a heater is shown at 1202, while the power level supplied to a laser diode is shown at 1204. Logic state 1200 may be determined by external logic, such as logic 1102 as shown in FIG. 11. The logic state 1200 lasts for a duration of time determined by the external logic, such as logic 1102 as shown in FIG. 11. Logic state 1200 may correspond to the preheating of a laser diode. Logic state 1200 also corresponds to a laser diode OFF state as power is quickly modulated between a laser diode power source and a heater power source. An average power level between the laser diode power 1204 and the heater power 1202 is shown at 1206. As can be appreciated, the power levels shown in logic state 1200 may be proportional to heat outputs of a laser diode and a heater, such that power level 1202 is proportional to the heat output of the heater, and power level 1204 is proportional to the heat output of the laser diode.

Figure 13:
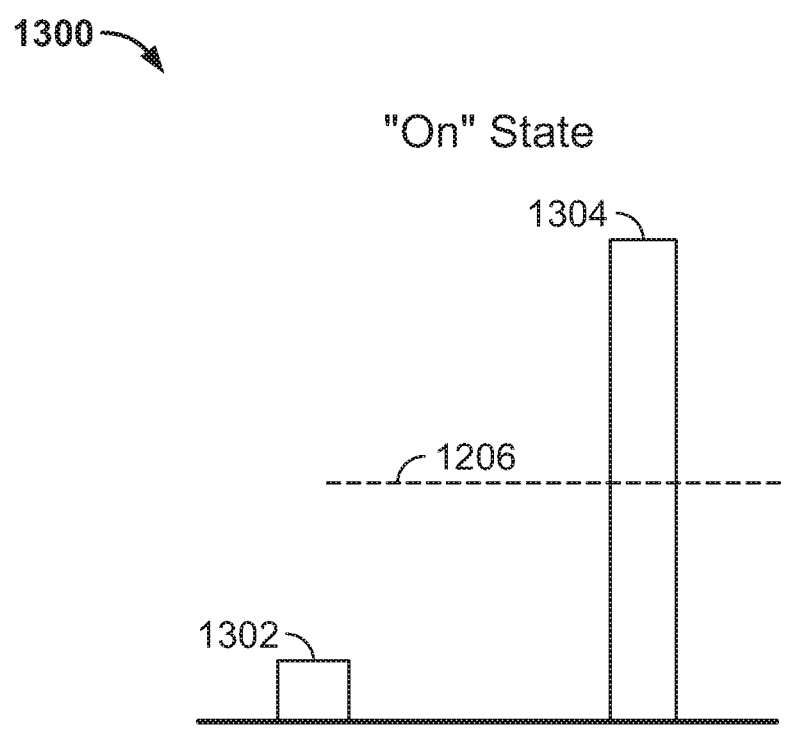
FIG. 13 is a graph showing a second logic state of a heater-on-heatspreader control system, according to an illustrative implementation.

FIG. 13 is a graph showing a second logic state of a heater-on-heatspreader control system, according to an illustrative implementation. Second logic state 1300 corresponds to a laser diode ON state as power is supplied primarily to the laser and the heater element is turned OFF. The power level 1304 is thus the power supplied to operate a laser diode, while power level 1302 is supplied to the heater. The average power level 1206 between the laser diode power 1304 and the heater power 1302 may be the same as that of the laser diode OFF state 1200 as shown in FIG. 12. The power levels shown in the second logic state 1300 may be proportional to heat outputs of a laser diode and a heater, such that power level 1302 is proportional to the heater heat output and power level 1304 is proportional to the laser diode heat output.

External logic, such as logic 1102 as shown in FIG. 11, may modulate rapidly between logic state 1200 as shown in FIG. 12 and the second logic state 1300 as shown in FIG. 13. The transition between logic state 1200 and logic state 1300 may be the result of a binary signal produced by external logic, such as logic 1102 as shown in FIG. 11. The transition between logic state 1200 and logic state 1300 may be the result of an analog signal produced by external logic, such as logic 1102 as shown in FIG. 11. During rapid modulation between logic state 1200 and the second logic state 1300, a short stabilization interval may improve the accuracy of any measurements taken with the laser diode output wavelength, because the output wavelength will spend less time oscillating about its target output wavelength. However, maintaining an average power output 1206 between logic states may ensure that stabilization interval of the output wavelength is reduced, because the average thermal output that results from the power supplied to the laser diode and the heater will not change even during modulation. Maintaining an average power output 1206 may also allow for temperature stability of a thermally coupled TEC or heat sink, because the modulation between logic states will not result in changes to the thermal transfer between the laser diode and the TEC or heat sink.

Figure 14:
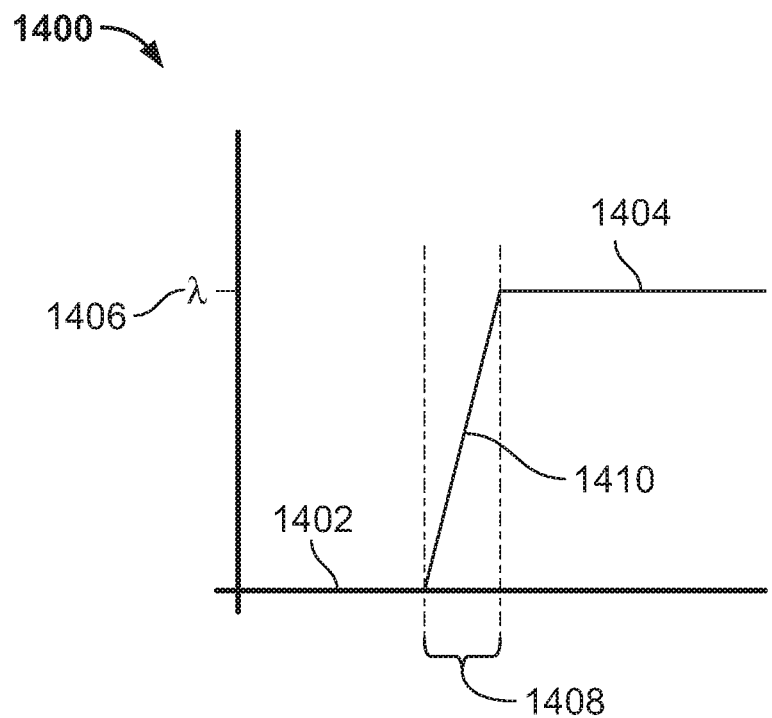
FIG. 14 is a graph showing a change in output wavelength of a laser coupled to a heater-on-heatspreader, according to an illustrative implementation.

FIG. 14 is a graph showing a change in output wavelength of a laser coupled to a heater-on-heatspreader, according to an illustrative implementation. Graph 1400 shows a transition of a laser (not shown), which is coupled to a heater-on-heatspreader (not shown), from an OFF state shown as output wavelength 1402 to an ON state at target output wavelength 1406 as shown at 1404. The heater-on-heatspreader may be any of the heaters-on-heatspreaders as described herein. The laser producing target output wavelength 1406 at 1404 may be any of lasers described herein. The OFF state shown at 1402 may correspond to the OFF logic state 1204 as shown in FIG. 12 and/or the OFF logic state 1302 as shown in FIG. 13. The output 1404 may correspond to the ON logic state 1202 as shown in FIG. 12, and/or the ON logic state 1304 as shown in FIG. 13. The transition between the OFF state shown at 1402 and the ON state, in which the laser diode The time interval shown at 1408 shows a stabilization interval over which the laser diode reaches its target output wavelength 1406. The stabilization interval 1408 may be less than 100 µs. The stabilization interval 1408 may be less than a target stabilization interval of 325 ms. The slope 1410, which shows the transition of the laser diode between the OFF state 1402 and the target output wavelength 1406 at 1404, may be a linear slope as shown in graph 1400. The target output wavelength 1406 is any lasing wavelength within the ultraviolet, visible or infrared radiation ranges of the electromagnetic spectrum. The target output wavelength 1406 may be a wavelength between 100 nm and 15,000 nm.

Figure 15:
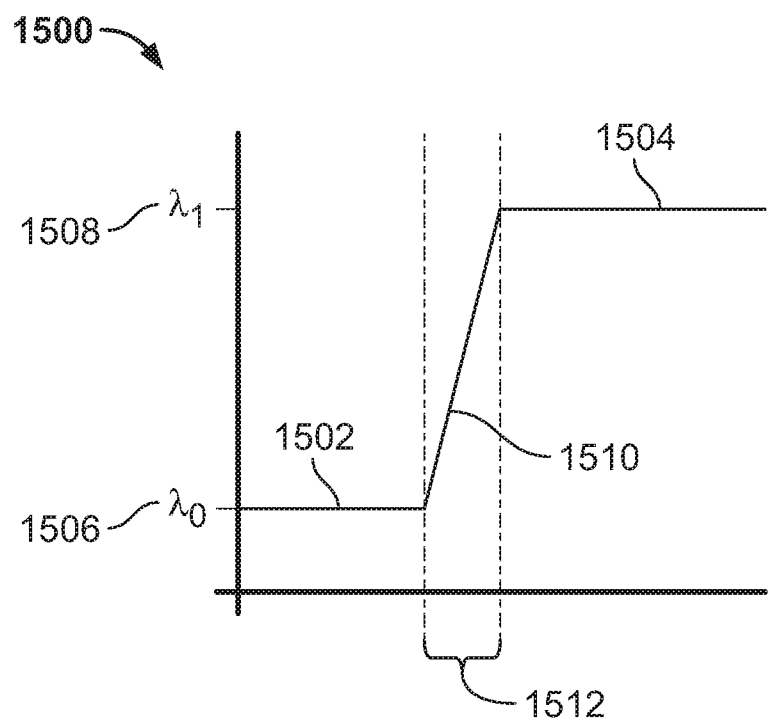
FIG. 15 is a graph showing another change in output wavelength of a laser coupled to a heater-on-heatspreader, according to an illustrative implementation.

FIG. 15 is a graph showing another change in output wavelength of a laser coupled to a heater-on-heatspreader, according to an illustrative implementation. Graph 1500 shows the transition of a laser (not shown) coupled to a heater-on-heatspreader (not shown) from a first wavelength $\lambda_0$ 1506 at 1502 to a second wavelength $\lambda_1$ 1508 at 1504. The stabilization interval 1512 is a time interval over which the laser transitions from the first wavelength $\lambda_0$ 1506 at 1502 to a second wavelength $\lambda_1$ 1508 at 1504. The stabilization interval 1512 may be less than 100 µs. The stabilization interval 1408 may be less than a target stabilization interval of 325 ms. The slope 1510 over which the laser transitions between the first wavelength $\lambda_0$ 1506 and the second wavelength $\lambda_1$ 1508 may be linear as shown at 1510 in graph 1500.

The transition from a first wavelength $\lambda_0$ 1506 at 1502 to a second wavelength $\lambda_1$ 1508 at 1504 may be the result of thermal tuning, or adjustment by external logic of power provided to either a heater (such as any of the heaters described herein) and/or a laser (such as any of the lasers described herein) coupled to a heater-on-heatspreader. Thus the first wavelength $\lambda_0$ 1506 may be within 1% of the second wavelength $\lambda_1$ 1508. The first wavelength $\lambda_0$ 1506 may also be any lasing wavelength within the ultraviolet, visible or infrared radiation ranges of the electromagnetic spectrum. The first wavelength $\lambda_0$ 1506 may be a wavelength between 100 nm and 15,000 nm. The second wavelength $\lambda_1$ 1508 may also be any lasing wavelength within the ultraviolet, visible or infrared radiation ranges of the electromagnetic spectrum. The first wavelength $\lambda_1$ 1508 may be a wavelength between 100 nm and 15,000 nm.

Thus systems and methods are provided for thermal regulation of a heat-generative device using a heater-on-heatspreader. The heater-on-heatspreader provides a stable thermal gradient for an associated heat-generating device, such as a laser diode, as the heat-generating device is switched from an ON state to an OFF state. The heater-on-heatspreader has associated logic which modulates power between a heater and a power source for the heat-generating device. The heater, heater power source, and power source for the heat-generating device are all incorporated onto a heatspreader, which allows for consolidation of both power and thermal control of a coupled heat-generating device.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for thermally regulating a laser diode, the method comprising:
  providing a heater-on-heatspreader laser diode system comprising:
    a heatspreader configured to spread heat over an area;
    a single heater disposed on the heatspreader, the single heater being electrically connected to a first power source such that when the single heater is in an ON state, the single heater uses electrical power from the first power source and produces heat, and such that when the single heater is in an OFF state, the single heater does not use electrical power from the first power source and does not produce heat; and
    a plurality of laser diodes disposed on the single heater so that the single heater is disposed between the plurality of laser diodes and the heatspreader, the plurality of laser diodes being electrically connected to a second power source such that when a laser diode of the plurality of laser diodes is in an ON state, that laser diode uses electrical power from the second power source and produces an optical emission and heat, and such that when a laser diode of the plurality of laser diodes is in an OFF state, that laser diode does not use electrical power from the second power source and does not produce an optical emission and heat;

wherein when the single heater is in an ON state, the heat produced by the single heater is transferred to the plurality of laser diodes and to the heatspreader for distribution to the plurality of laser diodes; and wherein when a laser diode is in an ON state, the heat produced by that laser diode is transferred to the heatspreader for distribution to the others of the plurality of laser diodes; and modulating power supplied by the first power source and the second power source such that the laser diodes of the plurality of laser diodes may be selectively cycled between an ON state and an OFF state using the second power source, and such that the single heater may be selectively cycled between an ON state and an OFF state using the first power source, such that an average temperature of the plurality of laser diodes remains constant.

2. The method of claim 1, wherein the single heater comprises a resistive heater.

3. The method of claim 2, wherein the optical emission produced by at least one laser diode of the plurality of laser diodes comprises at a single wavelength.

4. The method of claim 1, wherein a laser diode of the plurality of laser diodes is preheated by the single heater before the laser diode is in an ON state.

5. The method of claim 4, wherein an output wavelength of the emission produced by the laser diode is tuned to a target wavelength by setting the single heater to an ON state and by adjusting the current supplied to the single heater by the first power source.

6. The method of claim 5, wherein the heater-on-heatspreader laser diode system is mounted to a temperature control plate such that the heater-on-heatspreader laser diode system and the temperature control plate are in thermal and electrical connection.

7. The method of claim 6, wherein:

the temperature control plate is thermally coupled to a plurality of heater-on-heatspreader laser diode systems, wherein the plurality of heater-on-heatspreader laser diode systems each comprise a plurality of laser diodes; and wherein thermally tuning the output wavelength of a single laser diode among the plurality of laser diodes does not change the temperature of the temperature control plate.

8. The method of claim 1, wherein the plurality of laser diodes comprises a first subset of laser diodes configured to emit a first target output wavelength, and a second subset of laser diodes configured to emit a second target output wavelength.

9. The method of claim 3, wherein logic, in signal communication with the first power source and the second power source, includes calibration data for the laser diode.

10. The method of claim 9, wherein the logic modulates power between the first power source and the second power source.

11. The method of claim 10, wherein the logic measures a temperature of the laser diode.

12. A method according to claim 1, wherein the step of modulating power is performed using external logic;

and wherein the method further comprises:

adjusting an output wavelength of a laser diode based on laser diode calibration data stored in the external logic; and maintaining an average thermal output between a thermal output of the single heater and a thermal output of a laser diode.

13. The method of claim 12, further comprising stabilizing the output wavelength of a laser diode within 10 µs after modulating the power supplied to the single heater by the first power source and the power supplied to the laser diode by the second power source.

14. The method of claim 13, wherein adjusting the output wavelength of a laser diode based on laser diode calibration data stored in the external logic further comprises determining a temperature of the laser diode from an electrical parameter measured from the heatspreader.

15. The method of claim 1 wherein at least one of the current and the voltage supplied by at least one of the first power source and the second power source is selectively varied.

* * * * *